United States Patent [19]

Wolfinger

[11] 4,156,186

[45] May 22, 1979

[54] METHOD AND APPARATUS FOR DETERMINING NEGATIVE SEQUENCE CURRENT IN A MULTI-PHASE DYNAMOELECTRIC MACHINE

[75] Inventor: John F. Wolfinger, Schenectady, N.Y.

[73] Assignee: General Electric Company, Schenectady, N.Y.

[21] Appl. No.: 849,096

[22] Filed: Nov. 7, 1977

[51] Int. Cl.² .................. G01R 29/16; G01R 25/00; H02H 3/28
[52] U.S. Cl. .................. 324/108; 324/86; 361/76
[58] Field of Search ............. 324/108, 107, 86; 361/76, 23

[56] References Cited

U.S. PATENT DOCUMENTS

| | | | |
|---|---|---|---|
| 2,897,407 | 7/1959 | Morris | 361/76 |
| 3,154,737 | 10/1964 | Hodges | 324/108 |

Primary Examiner—Rudolph V. Rolinec
Assistant Examiner—Ernest F. Karlsen
Attorney, Agent, or Firm—John F. Ahern; James W. Mitchell; Ormand R. Austin

[57] ABSTRACT

A method and apparatus are disclosed for accurately determining negative sequence current in a three-phase turbine-driven generator, the currents indicative of power oscillations and of torques harmful to turbine buckets. A signal conditioner and phase-shifter network are described which provide precise amplitude and phase angle adjustments and null balancing features which permit accurate determination of the magnitude of negative sequence current even though this current is a very small quantity determined as the difference between two large signals.

9 Claims, 2 Drawing Figures

METHOD AND APPARATUS FOR DETERMINING NEGATIVE SEQUENCE CURRENT IN A MULTI-PHASE DYNAMOELECTRIC MACHINE

BACKGROUND OF THE INVENTION

This invention relates to measurement of electrical signals in power generating equipment and in particular to a method and apparatus for accurately determining negative sequence currents indicative of power oscillations in a multi-phase dynamoelectric machine.

A multi-phase dynamoelectric machine such as a three-phase steam turbine-driven generator used to produce electric power is designed to operate at constant power output and with equal currents in each of the phase lines. At times, however, imbalance of the external load results in power oscillations which yield unbalanced currents in the phase lines. These oscillations and unbalanced currents, in addition to producing temperatures in excess of design levels in one or more stator windings, also produce a non-symmetrical magnetic flux field across the air gap between rotor and stator. This field can be regarded as the sum of two fields, one, the primary, rotating with the rotor and the other rotating in the reverse direction, or in negative sequence. The negative sequence field in turn produces pulsating torques in the rotor shaft and stator core typically at twice the generator operating, or synchronous, frequency of 60 Hz. Although the amplitude of the pulsating torques may be small compared with total shaft torque, their frequency of about 120 Hz may be close to the natural frequencies of certain components of the turbine-generator assembly, and in particular to the natural frequency of certain buckets or blades of the turbine rotor which drives the generator rotor by means of an interconnecting shaft. Thus, the bucket vibrations and other motions which develop as a result of the pulsating torques can become appreciable, leading to bucket damage, for example to fatigue failure of bucket tie wires.

In order to assess the effects of negative sequence current on turbine buckets and other turbine-generator components and to implement procedures to avoid or correct for them, accurate determination of negative sequence current level is required. While devices for measuring these currents are presently in use at power stations, the negative sequence currents obtained are values averaged over considerable time intervals. Moreover, in part because measurement of negative sequence current typically involves determination of a small difference between two large signals, the values obtained by prior art devices are not sufficiently precise to convey all the information required for assessing and controlling bucket motions.

Accordingly, it is an object of the invention to provide a method and apparatus for accurately determining a negative sequence signal indicative of power oscillations in a multi-phase generator.

It is a more particular object of the invention to provide a method and apparatus for providing continuous, accurate values of negative sequence current in a three-phase turbine-driven generator.

SUMMARY OF THE INVENTION

A method and apparatus are provided for determining a negative sequence signal indicative of power oscillations in a multi-phase dynamoelectric machine. In a preferred embodiment of the invention, a negative sequence current circuit for a three-phase turbine-driven generator includes a signal conditioner for adjusting the amplitudes of three signals representative of the currents in phase lines of the generator to form a set of conditioned signals whose sum is zero, a phase-shifter network to shift the phase of a preselected conditioned signal of the set precisely 120 degrees, and an amplifier network for subtracting the phase-shifted signal from another conditioned signal of the set and applying a gain coefficient to yield the desired negative sequence current. Precise adjustment of signal amplitudes and phase angles is assured by the use of matched resistors and null balancing relationships in the negative sequence current circuit, which permits accurate calculation of negative sequence current as the difference between two large quantities.

BRIEF DESCRIPTION OF THE DRAWINGS

While the specification concludes with claims particularly pointing out and distinctly claiming the subject matter regarded as the invention, the invention will be better understood from the following description taken in connection with the accompanying drawings in which:

DETAILED DESCRIPTION OF THE INVENTION

Figure 1:
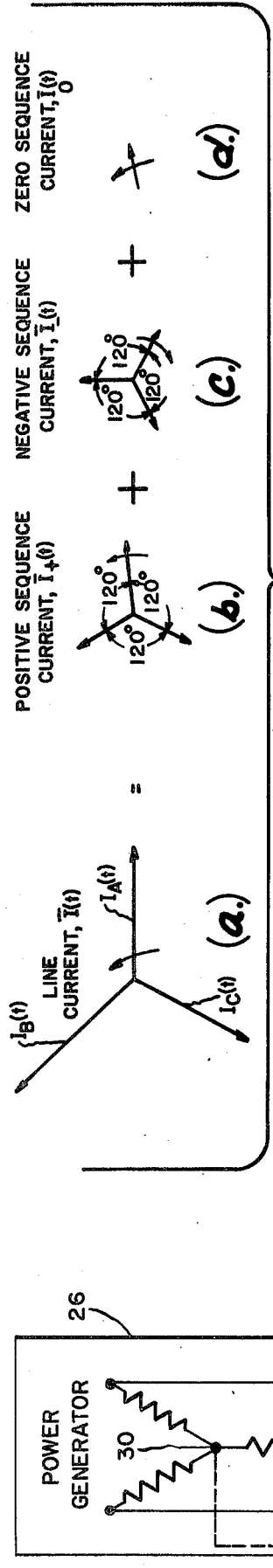
FIG. 1 shows a circuit for determining negative sequence current according to the present invention.

As illustrated in FIG. 1, which shows a preferred embodiment of the negative sequence current circuit of the invention, three phase lines 20, 22, and 24 emanate from wye-connected power generator 26 and carry line currents $I_A(t)$, $I_B(t)$, and $I_C(t)$ for transmission to an external load (not shown). A neutral line 28, shown dashed, may also be provided. Neutral line 28, if included, carries a current $I_0(t)$, which for generating systems in which the portion of neutral line 28 within power generator 26 is connected to ground through a high impedance, will be very small or essentially zero compared to the three line currents $I_A(t)$, $I_B(t)$, and $I_C(t)$.

Figure 2:
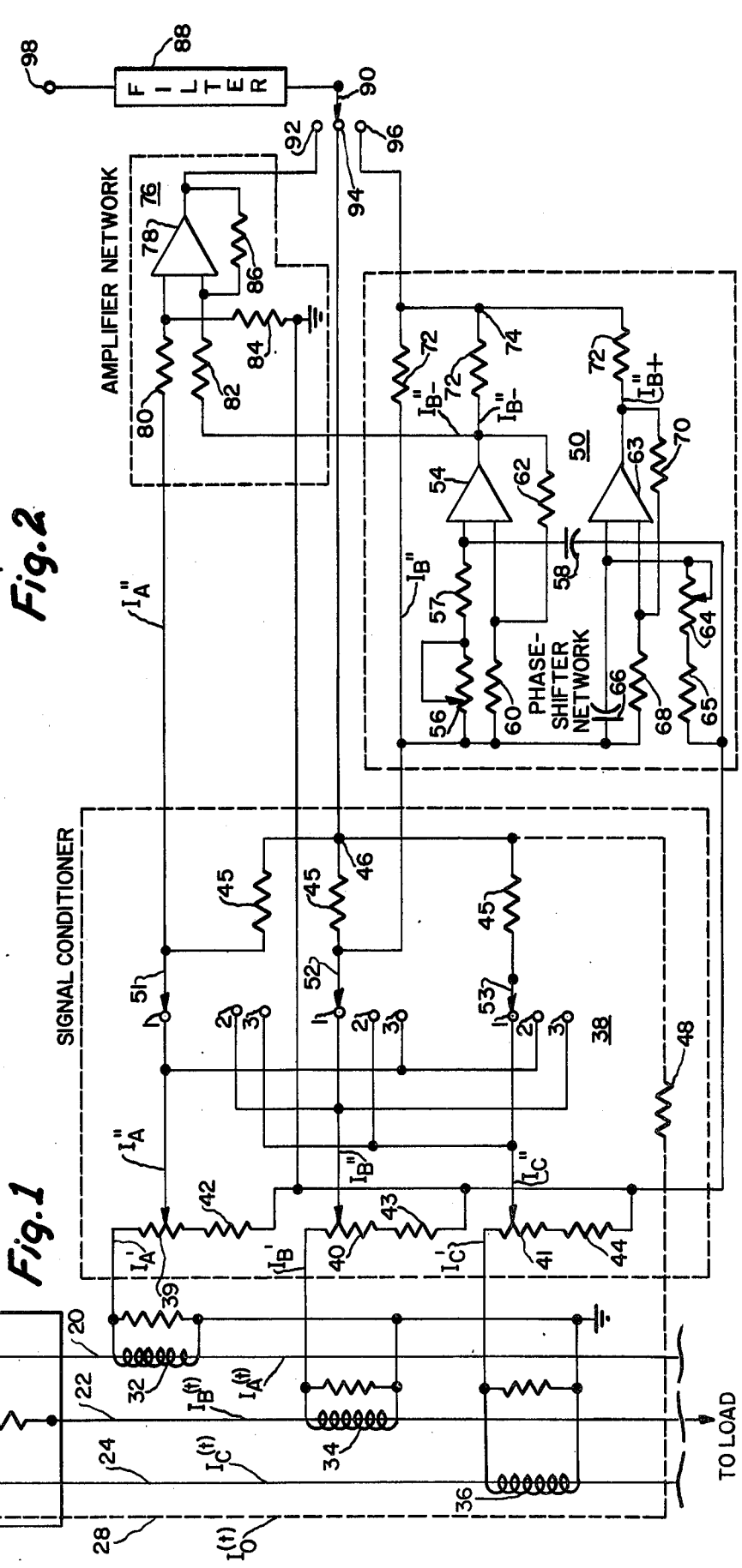
FIG. 2 is a plot indicating in phasor representation three line currents expressed as the sum of components of three sequence currents.

The line currents $I_A(t)$, $I_B(t)$, and $I_C(t)$ may be considered components of the line current phasor set $\overline{I}(t)$ shown in FIG. 2a, and each may be written as the sum of components of three currents known as sequence currents. These sequence currents, whose phasor representation is indicated in FIG. 2, are (1) the positive sequence current $\overline{I}_+(t)$, which comprises three equally spaced components of equal magnitude which rotate counterclockwise on a phasor plot (FIG. 2b); (2) negative sequence current $\overline{I}_-(t)$, the determination of the value of which is an important objective of the invention, which comprises three equally spaced components of equal magnitude which rotate clockwise (FIG. 2b); and (3) the zero sequence current $\overline{I}_0(t)$, which comprises three identical components which rotate counterclockwise (FIG. 2d). The algebraic relationship between the line current $\overline{I}(t)$ and the sequence currents $\overline{I}_+(t)$, $\overline{I}_-(t)$, and $\overline{I}_0(t)$ is indicated in FIG. 2.

Under ideal conditions of power generation and loading, the line currents have equal amplitudes and are equally spaced 120° apart in phase angle, and the negative sequence current is zero. However, when an imbalance occurs between the power generated and the external load, power oscillations and small amplitude and phase angle shifts occur in $I_A(t)$, $I_B(t)$, and $I_C(t)$, leading to nonzero negative sequence currents and pulsating torques at frequencies near the natural or resonant frequencies of certain turbine buckets. By application of Kirchhoff's Law for the sum of currents at terminal 30 of power generator 26 to the line currents $I_A(t)$, $I_B(t)$, and $I_C(t)$ expressed in terms of the three sequence currents, it can readily be shown by mathematical reduction that each component of the negative sequence current $\overline{I_-}(t)$ is equal, except for a multiplier, to the difference between one line current and a second line current phase-shifted 120 degrees. Thus in algebraic form, each component of $\overline{I_-}(t)$ is of the form $$I_-(t) = [I_A(t) - I_B(t - 1/3f_0)]/\sqrt{3} \qquad \text{(Eq. 1)}$$

where $F_0$ is the synchronous line frequency, typically 60 Hz. The other components of negative sequence current $\overline{i_-}(t)$ may also be expressed by equations identical to Equation 1 above except for the substitution for the subscripts (A,B) the combination (B,C) or (C,A), which, as discussed in more detail below, permits a check on the accuracy of the negative sequence current circuit of the invention.

Accurate determination of the magnitude of the negative sequence current, as is required to correctly assess turbine bucket resonances, is difficult to achieve in term of the difference between one line current and a second current shifted 120 degrees as set forth in Equation 1 above because each component of negative sequence current $\overline{I_-}(t)$ is typically a very small quantity compared with the large line currents (note that the phasors shown in FIG. 2 are not drawn to scale) and also because there is no readily available means in present measuring equipment to produce the required phase shift of exactly 120 degrees. Moreover, at power stations where it is desirable to monitor negative sequence currents, signals representing the line currents are available at voltage levels sufficiently low for safe measurement only through step-down current transformers which introduce small but unknown amplitude and phase shift errors in the line currents at the synchronous line frequency of 60 Hz.

The negative sequence current circuit of FIG. 1 includes features to overcome the above-mentioned problems and permit accurate and continuous calculation of negative sequence current. Lines 20, 22, 24 and 28 emanating from power generator 26 carry current signals $I_A$, $I_B$, $I_C$, and $I_0$, whose sum is zero according to Kirchhoff's Law (for convenience, reference to the time dependence of all current signals has been omitted here and in the remaining discussion). Transformers 32, 34, and 36 step-down the voltages of signals $I_A$, $I_B$, and $I_C$ to safe measurement levels, producing a set of current signals $I_A'$, $I_B'$, and $I_C'$ representative of the line currents but including small unknown amplitude and phase shift errors such that the sum of signals $I_A'$, $I_B'$, $I_C'$, and $I_0$ may be nonzero and thus not satisfy a key step in the derivation of Equation 1. However, if the assumption is made that transformers 32, 34, and 36 all produce the same phase angle shifts at 60 Hz, then signals $I_A'$, $I_B'$, and $I_C'$ may be readjusted to again sum to zero by signal conditioner 38. Signal conditioner 38 includes an adjustment network comprising potentiometers 39, 40, and 41 by which signals $I_A'$, $I_B'$, and $I_C'$ each can be multiplied by a factor close to unity, and resistors 42, 43, and 44, whose resistances are typically many times the resistance of potentiometers 39, 40, and 41 in order to limit the range of signal adjustment provided thereby. The conditioned signals $I_A''$, $I_B''$, and $I_C''$ produced by the adjustment network are added by means of resistors 45, which are selected to provide closely matched resistances (e.g., to ±0.01 percent) over the expected ambient temperature range of the negative sequence current circuit. By suitable adjustment of potentiometers 39, 40, and 41, signals $I_A''$, $I_B''$, and $I_C''$ may be varied to produce a voltage of zero at point 46. (If signal $I_0$ is available, it may also be added through resistor 48 to generate the voltage at 46 although, as mentioned previously $I_0$ is typically of negligible magnitude).

When zero voltage is obtained at point 46, the set of conditioned signals $I_A''$, $I_B''$, and $I_C''$, with respect to accurately representing the line currents $I_A$, $I_B$, $I_C$, include equal phase angle errors and small amplitude errors, but satisfy the relationship $I_A'' + I_B'' + I_C'' + I_0 = 0$. The equal phase errors are unimportant in determination of the magnitude of negative sequence current, and the small amplitude errors, although ultimately resulting in some error in the negative sequence current calculated, produce error on a percent basis, i.e., a one percent error in $I_A$ yields a one percent error in negative sequence current, not a one percent of $I_A$ error in negative sequence current.

In order to accurately shift the phase of a conditioned signal by 120 degrees, one of the conditioned signals is fed to phase-shifter network 50, the particular signal chosen (e.g., $I_B''$ in the operating mode illustrated in FIG. 1) determined by the selected position of switches 51, 52, and 53 of signal conditioner 38, the switches typically linked to form a three-pole, three-position switching device which, as explained more fully below, permits calculation of negative sequence current using any two of the three line current signals. Amplifier 54 of phase-shifter network 50, in cooperation with potentiometer 56, phase shift adjustment-limiting resistor 57, and capacitor 58, produces a signal phase angle shift of −120 degrees and a signal gain of unity, the closeness to unity determined by the matching accuracy of the resistance values of input resistor 60 and feedback resistor 62. Amplifier 63, in cooperation with potentiometer 64, phase shift adjustment-limiting resistor 65, and capacitor 66, produces a signal phase angle shift of +120 degrees, and a gain of unity as determined by matched input resistor 68 and feedback resistor 70. The output signals $I_{B-}''$ and $I_{B+}''$ from amplifiers 54 and 63 are added to conditioned signal $I_B''$ by means of matched resistors 72. By suitable adjustment of potentiometers 56 and 64, which alter the phase but not the amplitude of signals $I_{B-}''$ and $I_{B+}''$, zero voltage may be attained at point 74. Then, since the only way three phasors ($I_{B-}''$, $I_{B+}''$, and $I_B''$) of equal nonzero amplitude can add to zero is if they are equally spaced 120 degrees from one another, the signal $I_{B-}''$ produced by phase-shifter network 50 must have, with respect to conditioned signal $I_B''$, an equal amplitude and a phase angle shift of −120 degrees.

To complete the calculation of negative sequence current according to Equation 1 above, differential amplifier network 76 is provided. Amplifier 78 of network 76 receives conditioned signal $I_A''$ from signal conditioner 38 at a first input terminal and phase-shifted signal $I_{B-}''$ from phase-shifter network 50 at a second input terminal. The amplifier 78 subtracts $I_{B-}''$ from $I_A''$, and also applies a gain of $1/\sqrt{3}$ through appropriate choice of resistance values in resistors 80, 82, 84, and 86. Amplifier network 76 thus produces a negative sequence current signal equal to the quantity $(I_A'' - I_{B-}'')/\sqrt{3}$.

Also included in the negative sequence current circuit of FIG. 1 is 60 Hz bandpass filter 88, which may be connected by means of switch 90 to negative sequence current terminal 92, current balance terminal 94, or phase balance terminal 96. Filter 88 permits removal of noise and other distortions such as the third harmonic (180 Hz) signal components which might otherwise interfere with accurate measurement of negative sequence current and with current and phase balance operations. Filter 88 may also include means to amplify the negative sequence current to supplement or substitute for the gain provided in differential amplifier network 76.

Switches 51, 52, 53 of signal conditioner 38 permit a check on the accuracy of the negative sequence current circuit by allowing calculation of negative sequence current using any two of the three line currents. These switches are preferably ganged for simultaneous switching between positions 1, 2, and 3, which respectively provide components of negative sequence current calculated from $(I_A'', I_{B-}'')$, $(I_B'', I_{C-}'')$, and $(I_C'', I_{A-}'')$. Once the currents and phases have been balanced for one combination to produce zero voltages at points 46 and 74, the magnitude of negative sequence current determined at the output terminal 98 of filter 88 should be the same for each of the three positions 1, 2, and 3 of switches 51, 52, and 53.

In operation, line currents $I_A$, $I_B$, and $I_C$ from power generator 26 are fed through step-down transformers 32, 34, and 36. The resulting set of current signals $I_A'$, $I_B'$, and $I_C'$ are conditioned by potentiometers 39, 40, and 41 which are adjusted (with switch 90 connecting filter 88 to current balance terminal 94) to yield conditioned signals $I_A''$, $I_B''$, and $I_C''$ which, together with current signal $I_0$ (if available), are summed to produce a zero voltage at point 46. With switches 51, 52 and 53 set, for example, in position 1, and switch 90 now connecting filter 88 to phase balance terminal 96, conditioned signal $I_B''$ is directed to amplifiers 54 and 63 of phase-shifter network 50. The phase-shifter network 50 produces two intermediate signals having phase shifts of approximately $-120$ degrees and $+120$ degrees with respect to conditioned signal $I_B''$ and amplitudes equal to that of $I_B''$. The two intermediate signals are then summed with conditioned signal $I_B''$, and the settings of potentiometers 56 and 64 are varied until the voltage at point 74 is zero, indicating a zero sum and the desired phase angle shifts of precisely $-120$ degrees and $+120$ degrees. The $-120$ degree phase-shifted current signal $I_{B-}''$ from amplifier 54 is then fed to amplifier network 76 which also receives as input the conditioned signal $I_A''$ from signal conditioner 38. With filter 88 now connected to negative sequence current terminal 92, amplifier 76 determines negative sequence current by calculating the quantity $(I_A'' - I_{B-}'')/\sqrt{3}$ for output to terminal 98. To check the accuracy of the negative sequence current circuit, switches 51, 52, and 53 may be moved to position 2 shown in FIG. 1, which will result in the phase-shifting of signal $I_C''$ and calculation of negative sequence current as $(I_B'' - I_{C-}'')/\sqrt{3}$, or to position 3, which will produce a negative sequence current calculated as $(I_C'' - I_{A-}'')/\sqrt{3}$. For an accurate circuit, all three values of negative sequence current will be the same.

While there has been shown and described what is considered a preferred embodiment of the invention, it is understood that various other modifications may be made therein and it is intended to claim all such modifications which fall within the true spirit and scope of the invention.

What is claimed is:

1. Apparatus for determining a negative sequence signal indicative of power oscillations in a multi-phase dynamoelectric machine, said apparatus comprising:

first means for conditioning a plurality of signals from said machine to provide a set of conditioned signals whose sum is zero;

second means for shifting the phase of a first conditioned signal of said set a preselected amount to produce a phase-shifted signal; and third means for combining said phase-shifted signal and a second conditioned signal of said yet to yield a negative sequence signal.

2. The apparatus of claim 1 wherein said dynamoelectric machine is a three-phase turbine-driven genertor and said first means comprises an adjustment network for adjusting the amplitudes of first, second, and third signals each representative of the current in a phase line of said generator to yield first, second, and third conditioned signals whose sum is zero; and adder means for combining said conditioned signals.

3. The apparatus of claim 2 wherein said second means comprises a phase-shifter network responsive to said first conditioned signal to produce a first phase-shifted signal having an amplitude equal to, and a phase angle 120 degrees less than, the amplitude and phase angle respectively of said first conditioned signal.

4. The apparatus of claim 3 wherein said phase-shifter network is further adapted to produce a second phase-shifted signal having an amplitude equal to and a phase angle 120 degrees greater than, the amplitude and phase angle respectively of said first conditioned signal.

5. The apparatus of claim 4 wherein said phase-shifter network includes means for adjusting the phase angles of said phase-shifted signals such that the sum of said first phase-shifted signal, said second phase-shifted signal, and said first conditioned signal is zero.

6. The apparatus of claim 2 wherein said first means also includes a switching device permitting use of different combinations of two of said first, second, and third conditioned signals in determining a negative sequence signal to provide a check on the accuracy of said apparatus.

7. A method for determining a negative sequence signal indicative of power oscillations in a three-phase dynamoeletric machine, said method comprising the steps of:

providing first, second, and third signals each representative of the current in a phase line of the dynamoelectric machine;

conditioning said signals to form a set of conditioned signals whose sum is zero;

shifting the phase angle of a first conditioned signal of said set a preselected amount to form a phase-shifted signal; and combining said phase-shifted signal with a second conditioned signal of said set to produce a negative sequence signal.

8. The method of claim 7 wherein said combining step comprises subtracting said phase-shifted signal from said second conditioned signal and multiplying the result by an appropriate factor.

9. The method of claim 7 wherein said phase-shifted signal has an amplitude equal to, and a phase angle 120 degrees less than, the amplitude and phase angle respectively of said first conditioned signal, and said phase-shifted signal is obtained by the steps of:

shifting the phase angle of said first conditioned signal by approximately −120 degrees to yield a first intermediate signal and by approximately +120 degrees to yield a second intermediate signal;

summing said two intermediate signals and said first conditioned signal; and adjusting the phase angles of said intermediate signals until the resultant of said summing step is zero, so that said first intermediate signal is then equal to said phase-shifted signal.

* * * * *